Figure 1:
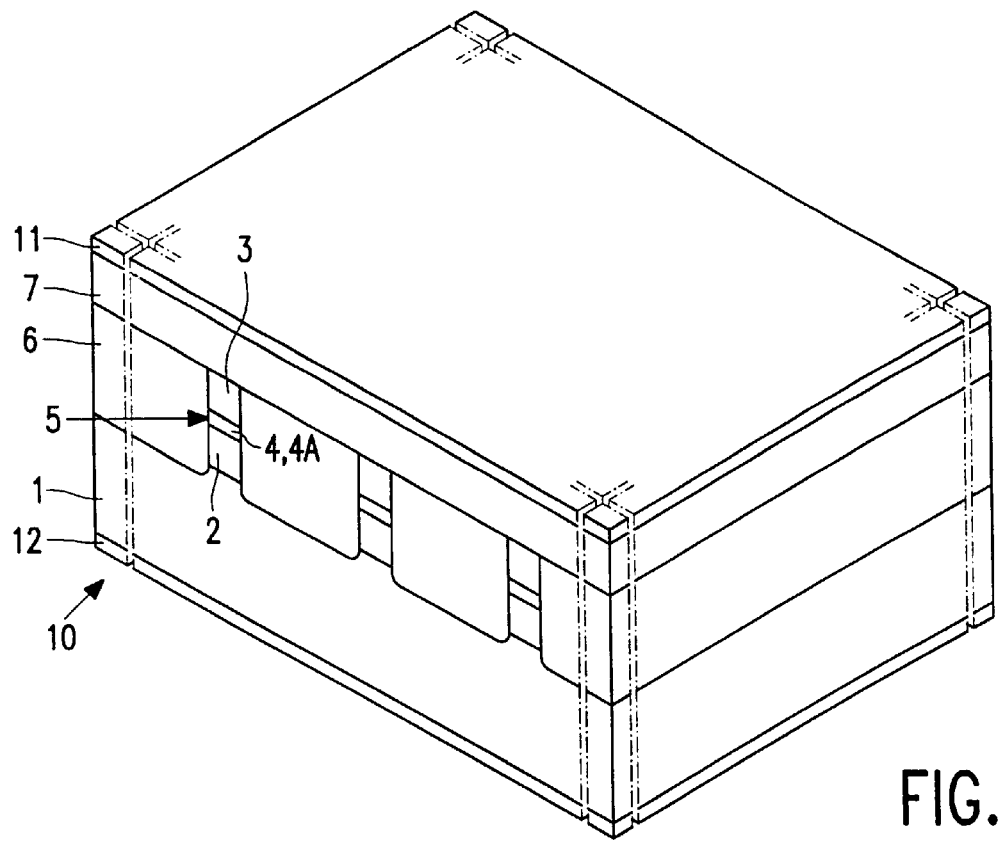
Figure 2:
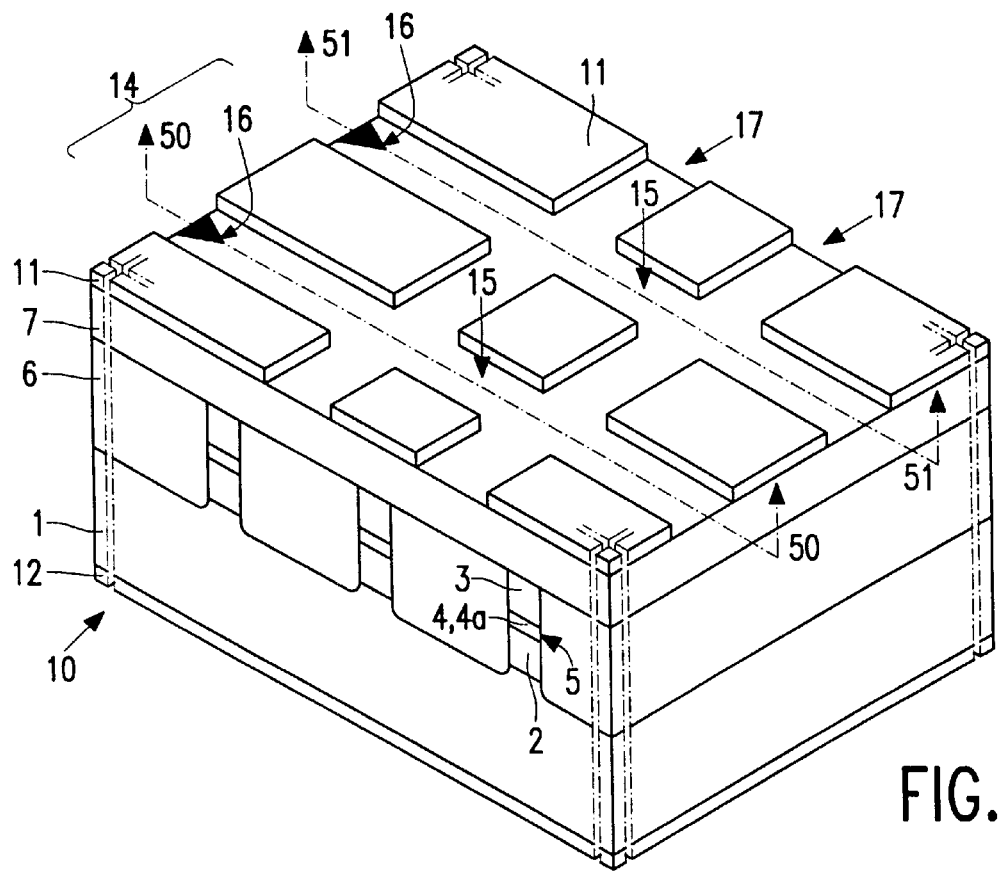
Figure 3:
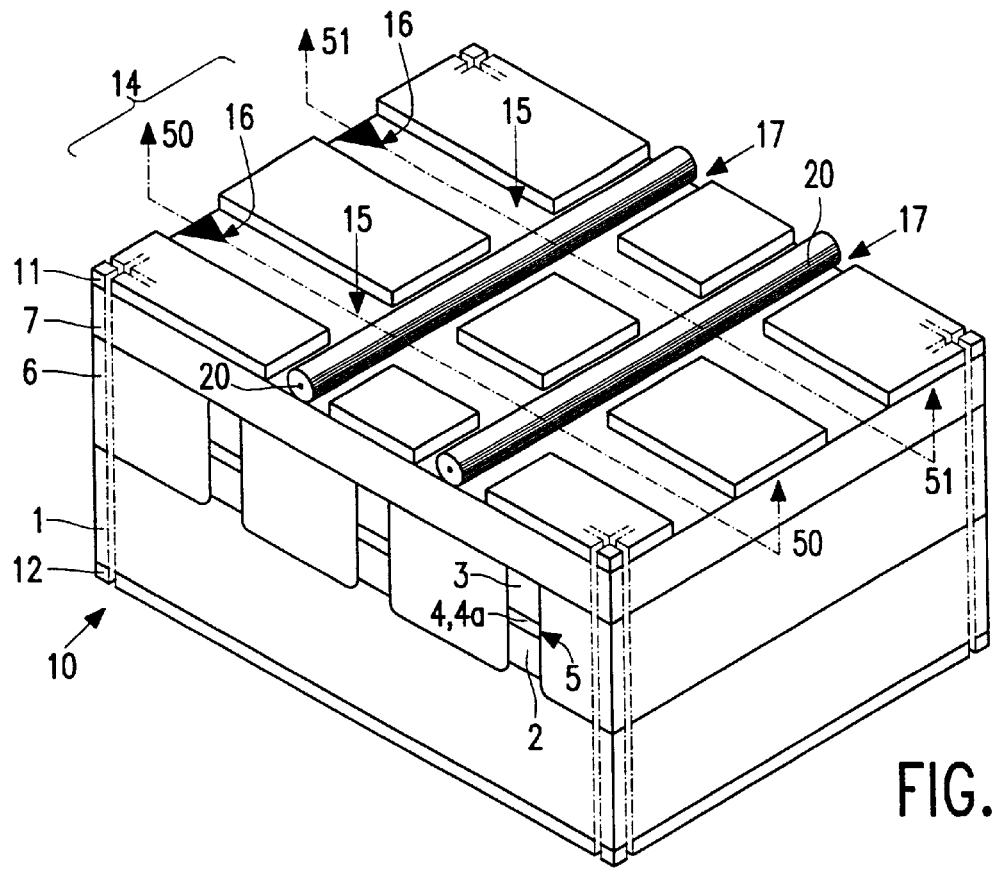
Figure 4:
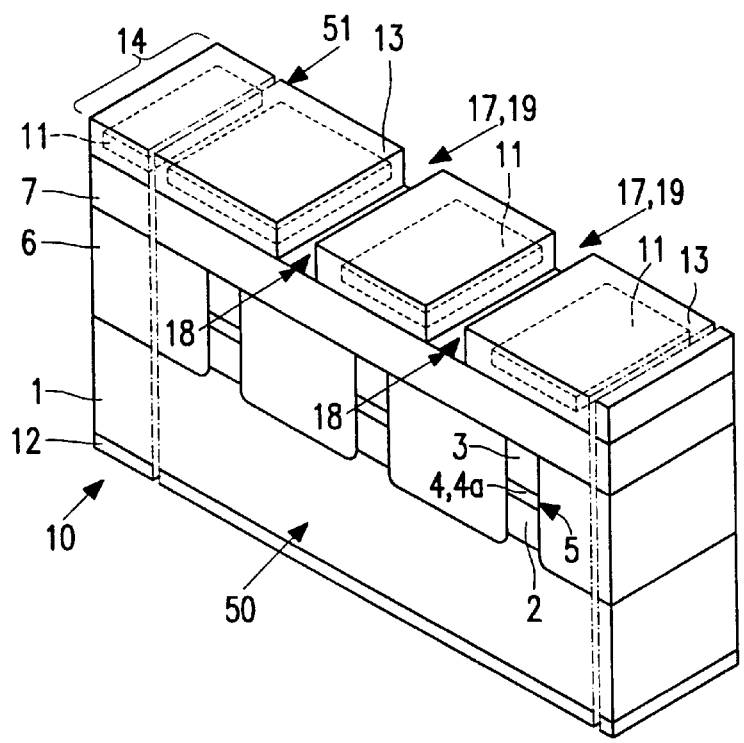

United States Patent [19]
Noordermeer et al.

[11] Patent Number: 5,915,163
[45] Date of Patent: Jun. 22, 1999

[54] METHOD OF MANUFACTURING A SEMICONDUCTOR DIODE LASER

[75] Inventors: Arjan Noordermeer; Marco Schmidt, both of Eindhoven, Netherlands

[73] Assignee: Uniphase Opto Holdings, Incorporated, San Jose, Calif.

[21] Appl. No.: 08/759,666

[22] Filed: Dec. 6, 1996

[30] Foreign Application Priority Data

Dec. 6, 1995 [DE] Germany .............................. 95203362

[51] Int. Cl.$^6$ ................................................. H01L 21/302
[52] U.S. Cl. ............................... 438/33; 438/26; 438/113
[58] Field of Search .............................. 438/26, 33, 113, 438/114

[56] References Cited

U.S. PATENT DOCUMENTS

| | | | |
|---|---|---|---|
| 4,380,862 | 4/1983 | Nyul | 438/26 |
| 5,418,190 | 5/1995 | Cholewa et al. | 438/33 |
| 5,460,318 | 10/1995 | Boudreau et al. | 228/123.1 |

OTHER PUBLICATIONS

"A Reliable Die Attach Method for High Power Semiconductor Lasers and Optical Amplifiers", by S.A. Merritt et al, 1995 Proc. of 45th Elec. Components & Technology Conf., May 21–24, 1995, pp. 428–430.

Primary Examiner—Charles Bowers
Assistant Examiner—Keith Christianson
Attorney, Agent, or Firm—Michael A. Glenn

[57] ABSTRACT

Method of manufacturing a laser which is provided with a metal layer and a solder layer as early as in the wafer stage, and which is particularly suitable for so-called epi-down final mounting. An individual laser is obtained in that first a block comprising a row of lasers is formed from the wafer by cleaving, and subsequently the individual lasers are separated from the block. Strip-shaped openings are formed in the metal layer at the areas of end faces to be formed before the block is formed, and subsequently a score is provided in the surface of the semiconductor body in each opening in the longitudinal direction thereof, whereupon the solder layer is provided over the metal layer and over at least part of the openings therein, and the block is subsequently formed through cleaving at the areas of and in the direction of the scores.

10 Claims, 3 Drawing Sheets

METHOD OF MANUFACTURING A SEMICONDUCTOR DIODE LASER

The invention relates to a method of manufacturing a semiconductor diode laser—often called laser for short hereinafter—whereby a semiconductor body is formed through the application on a substrate of a semiconductor layer structure with at least a first cladding layer of a first conductivity type, an active layer, and a second cladding layer of a second conductivity type opposed to the first, while in the active layer at least one strip-shaped active region is formed in a resonance cavity which is situated between two end faces to be formed and whose longitudinal axis is approximately perpendicular to the end faces to be formed, and the cladding layers are provided with current supply means which comprise at least a metal layer which is applied to the surface of the semiconductor layer structure and which is provided with a solder layer, whereupon the semiconductor body is cleaved so as to form a block whose longitudinal axis is perpendicular to that of the at least one strip-shaped active region, whose side faces form the end faces, and from which individual semiconductor diode lasers can be obtained through cleaving or breaking. The term laser is understood to cover a laser amplifier as well in this document.

Such a method is known from the article "A Reliable Die Attach Method for High Power Semiconductor Lasers and Optical Amplifiers" by S. A. Merritt et al., published on pp. 428–430, the 1995 Proceedings of 45th Electronic Components & Technology Conference, held in Las Vegas, U.S.A., May 21–24, 1995. It describes how a semiconductor body for a laser is formed in that a thin metal layer and a 2.5 $\mu$m thick solder layer comprising indium are provided on an epitaxial layer structure. 20 $\mu$m wide lanes are etched into this at the areas of the end faces to be formed, and similar openings of 60 $\mu$m width are formed on either side of a strip-shaped active region. A block formed after cleaving of the semiconductor body yields individual lasers after breaking or further cleaving. An individual laser is fastened with its side having the semiconductor layer structure to a support body to achieve a good removal of the heat generated in the laser. The support body is provided with a further solder layer, 2 $\mu$m thick, comprising tin, and having a surface area greater than the laser to be soldered so as to obtain a good soldering quality.

It is a disadvantage of the known method that it is comparatively labor-intensive, inter alia because two solder layers are used, one on the laser and one on the support body. Another disadvantage is that the further solder layer on the support body, which has a greater surface area than the laser, may creep up, for example, against the end faces of the laser upon melting and cause short-circuits. It should be borne in mind that the mounting method for the laser on a support body or cooling body as mentioned above implies that the pn junction of the laser is within a few micrometers of the solder layers.

It is an object of the invention to provide a method by which lasers with excellent soldering properties can be obtained, which is simple, and which brings with it substantially no risk of short-circuits during soldering.

According to the invention, a method of the kind mentioned in the opening paragraph is for this purpose characterized in that at least two strip-shaped openings are formed in the metal layer at the areas of the end faces to be formed before the formation of the block, subsequently a score is provided in the surface of the semiconductor body in the strip-shaped openings and in the longitudinal direction thereof, whereupon the solder layer is provided over the metal layer and over at least a portion of the strip-shaped openings in the metal layer, and the block is formed through cleaving at the areas of and in the direction of the scores. The provision of strip-shaped openings in the metal layer at the areas of the end faces to be formed has the result that the semiconductor body can be cleaved more easily and better when a score is made in said openings. The method especially prevents the metal layer from being torn off irregularly upon cleaving, thus forming portions projecting from an end face which after being bent against the end face may cause a short-circuit of the pn junction. The minimum width required for such scoring lanes is approximately 20 $\mu$m. The provision of a score in the strip-shaped openings already before the provision of the solder layer renders it possible to deposit the solder layer to close to the end faces to be formed. This partial covering of the openings with the solder layer has the important advantage that solder will be present also adjacent the end faces to be formed upon soldering of the laser, for example no further away from these end faces than a few micrometers. This promotes a satisfactory soldering adjacent said end faces, so that the heat removal there is also an optimum. Mirror degradation, which reduces the useful life of the laser, is reduced or even avoided thereby. The semiconductor body can still be cleaved very well when the openings are partly coated with a solder layer after the scores have been placed therein. The above implies that the solder layer may very well be provided in the wafer stage in a method according to the invention, which renders manufacture simple. The solder layer chosen may be, for example, indium.

In a major embodiment of a method according to the invention, the strip-shaped openings in the metal layer are fully covered by the solder layer. It was surprisingly found that the semiconductor body can still very well be cleaved into blocks in that case. The side faces of a block are still very planes then and undamaged adjacent the surface of the semiconductor body and at the level of the semiconductor layer structure. This is essential for a good operation of the laser. Indeed, the side faces of the block form the end faces of the laser. It is highly surprising, furthermore, that good end faces can also be formed upon cleaving when the solder layer is comparatively thick, for example 1 to 8 $\mu$m thick. A thick solder layer on the laser renders it possible to solder the laser securely on a support body, while no or only a thin solder layer is present on this support body. The risk of short-circuits may be reduced thereby. When no further solder layer is provided on the support body, moreover, the manufacture, which includes final mounting, is much simplified. Excellent results were obtained especially with a solder layer thickness on the laser of between 1 and 5$\mu$m. Very good results were obtained in soldering of individual lasers on a support body in a so-called reflow oven with a solder layer thickness of approximately 4 $\mu$m. The optimum layer thickness is somewhat lower, i.e. approximately 2 $\mu$m when soldering takes place on a so-called die bonder.

In a preferred embodiment of a method according to the invention, the solder layer is formed by an AuSn solder, preferably comprising approximately 80% Au and approximately 20% Sn by weight. Such a solder, which is somewhat brittle, yields the best results in the formation of the block, especially if the solder layer covers the strip-shaped openings entirely and is comparatively thick. An additional advantage of such a solder is that the use of a flux, which would have to be removed again, is unnecessary. This simplifies the method according to the invention further and increases the yield and useful life of the lasers.

In a further favorable modification, further strip-shaped openings are provided in the metal layer on either side of and parallel to the strip-shaped active region, preferably simultaneously with the strip-shaped openings mentioned earlier. This renders it possible to indicate the positions of individual lasers in a simple manner and to separate said lasers from the block obtained. This may be done, for example, in that perpendicular to said score a further score is provided in the surface of the semiconductor body in the further strip-shaped openings at the area of the block to be formed before the solder layer is provided, whereupon the solder layer is provided partly or entirely over said further strip-shaped openings again and, after the block has been formed, the latter is cleaved at the areas of the further scores. The individual lasers are obtained thereby. This method does involve the risk of the block itself being prematurely cleaved during the formation of the block by cleaving, which is obviously undesirable.

The latter problem is avoided in a particularly favorable modification of a method according to the invention wherein, after the provision of the further strip-shaped openings, other strip-shaped openings are formed in the solder layer above said further strip-shaped openings, after which the block is formed and is broken or, after openings have been provided in the surface of the block in the further and other strip-shaped openings, is cleaved at the areas of the further and other strip-shaped openings. The individual lasers are obtained thereby. The other openings may be formed in various ways, for example through photolithography and etching after the solder layer has been provided. Another possibility is the use of a photolithographic lift-off process in the application of the solder layer. Preferably, however, the other strip-shaped openings in the solder layer are formed in that wires are laid on the surface of the semiconductor body at the areas of the further strip-shaped openings before the solder layer is provided. This is preferably done by the use of a so-called wire mask. The diameter of the wires is then preferably chosen to be approximately equal to the width of the further strip-shaped openings.

In a method according to the invention, openings may also be formed in the solder layer above the strip-shaped openings in the metal layer. These openings, however, should be smaller than the strip-shaped openings according to the invention, so that the solder layer can be provided as close as possible to the end faces to be formed. These openings may also be realized by means of a suitable wire mask. If openings are formed in the solder layer above the strip-shaped openings and above the further strip-shaped openings, a mask of holes may be used instead of a wire mask. A suitable choice is then made as to the width of the separation between two holes in two mutually perpendicular directions.

In an important modification of a method according to the invention, the semiconductor body of an individual laser obtained is fastened exclusively by means of the solder layer to a support body having a further metal layer. The strip-shaped openings and the further strip-shaped openings are preferably formed by photolithography and etching, and the solder layer is preferably provided by vapor deposition or sputtering. The side faces of the block may be provided with a coating in view of the desired reflection of the end faces and/or to provide protection for the end faces.

Figure 5:
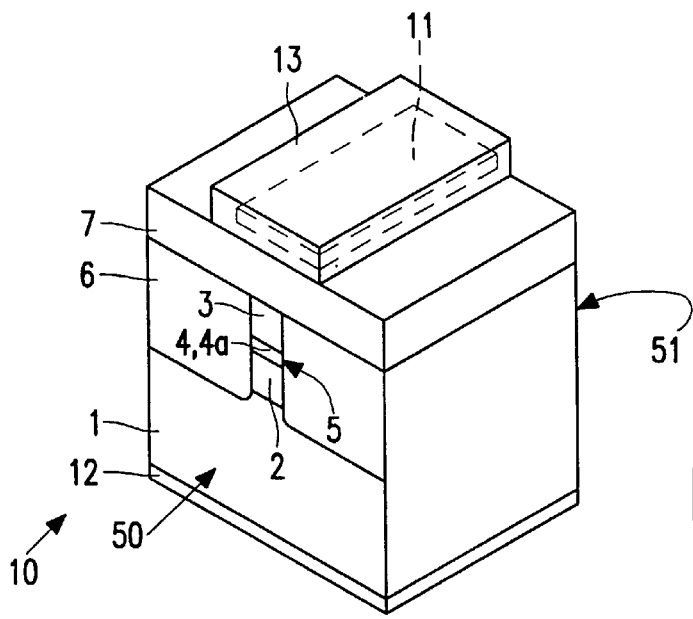
Figure 6:
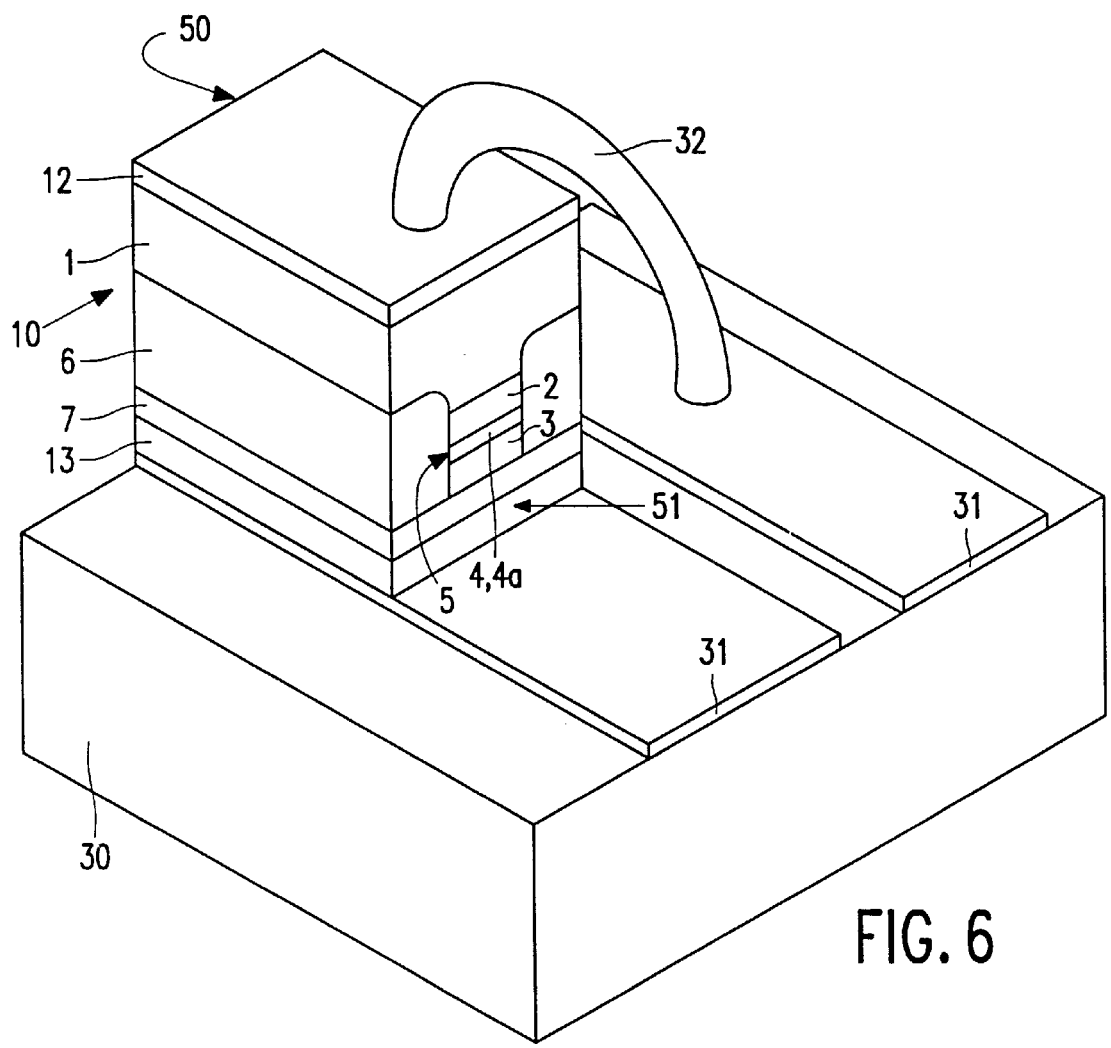

The invention will now be explained in more detail with reference to an embodiment and the accompanying drawing, in which FIGS. 1 to 5 diagrammatically and in perspective view show a semiconductor body of a semiconductor diode laser in consecutive stages of manufacture by a method according to the invention, and FIG. 6 diagrammatically and in perspective view shows a semiconductor diode laser manufactured by a method according to the invention and mounted on a support body.

The Figures are purely diagrammatic and not drawn true to scale. Corresponding parts have been given the same reference numerals in the various Figures as a rule. The interruptions shown at the edges of the Figures are used to indicate that the surface structure shown in the Figures is periodically repeated in two directions.

FIGS. 1 to 5 diagrammatically and in perspective view show a semiconductor body of a semiconductor diode laser in consecutive stages of manufacture by a method according to the invention. The method starts (see FIG. 1) with a substrate 1 of n-type InP with a thickness of approximately 360 $\mu$m and a (100) orientation. A semiconductor layer structure 2, 3, 4, 6, 7 is provided thereon. This is done as follows: first a plane layer structure is provided by MOVPE (=Metal Organic Vapor Phase Epitaxy) comprising a first cladding layer 2 of n-type InP, an active layer 4 of InGaAsP, and a second cladding layer 3 of p-type InP. Strip-shaped mesas 5 are subsequently formed therein by photolithography and etching. Each mesa 5 comprises portions of the substrate 1, the cladding layers 2, 3 and the active layer 4 and is a few $\mu$m wide. The strip-shaped portion 4A of the active layer 4 lying within a mesa 5 forms the strip-shaped active region 4A of a laser to be formed. The latter is formed within a resonance cavity whose longitudinal axis coincides with that of the mesa 5 and which is bounded by the end faces to be formed which will be parallel to the plane of drawing. The space situated between the mesas 5 is subsequently selectively filled with a third cladding layer 6 of SI (=Semi Insulating) InP by MOVPE. A contact layer 7 of p-type InGaAsP is provided over the resulting structure. After the thickness of the substrate 1 has been reduced to approximately 100 $\mu$m through polishing, a metal layer 12 is provided on the substrate 1, by sputtering in this case, and a metal layer 11 is provided on the surface of the layer structure 2, 3, 4, 6, 7. The metal layers 11, 12 together with the adjoining portions of the semiconductor body 10 serve to realize the current supply to the laser to be formed. The metal layer 12 in this example is an approximately 100 nm thick AuGeNi layer, and the metal layer 11 is a TiPtAu or PtTaPtAu layer, and is approximately 400 nm thick. Then the semiconductor body 10 is subjected to a heat treatment at approximately 400 degrees F., whereby an ohmic contact is formed between the metal layers 11, 12 and the semiconductor body 10.

Subsequently, (see FIG. 2), at least two strip-shaped openings 15 are formed in the metal layer 11, here by photolithography and etching. In this example, at least two further strip-shaped openings 17 are formed in the metal layer 11 on either side of and parallel to the strip-shaped active region 4A simultaneously with and in the same manner as the strip-shaped openings 15. The pitch of the openings 15, 17 is approximately 300 $\mu$m, and their widths are approximately 20 $\mu$m and approximately 50 $\mu$m, respectively. A score 16 is then provided in the surface of the semiconductor body 10, adjacent an edge thereof, within each opening 15, here by means of a scoring unit provided with a diamond cutter.

Subsequently (see FIG. 3), wires 20 are placed on the surface of the semiconductor body 10 at the areas of the further strip-shaped openings 17 in the metal layer 11. The wires 20 are made of tungsten here and form part of a wire mask which is not shown in the drawing. The length and diameter of the wires 20 are 20 mm and 50 μm, respectively, in this case. The assembly is now placed in a device for providing a solder layer, here a device for sputtering of layers, and a solder layer 13 (see FIG. 4) is provided over the metal layer 11, the openings 15, 17, and the wires 20. The material chosen for the solder layer 13 is an AuSn solder here which comprises approximately 80% Au and 20% Sn by weight. The thickness chosen for the solder layer 13 is 4 μm. The removal of the wires 20 leads to the creation of other openings 19 in the solder layer 13, which openings are approximately 20 μm wide here and lie above the further openings 17 in the metal layer 11. Then (see FIGS. 3 and 4), a block 14 is formed by cleaving at the areas of the scores 16, which block comprises a row of lasers to be formed, while its side faces 50, 51 form the end faces 50, 51 of the lasers to be formed. The side faces 50, 51 in this example are provided with a coating (not shown) which serves to give the end faces 50, 51 of the lasers to be formed a sufficiently low reflection value. The coating is provided by sputtering.

Subsequently (see FIG. 4), a further score is provided in the surface of the block 14 formed in each opening 17, 19 near a side face 50 of the block 14. Cleaving at the areas of the further scores 18 then separates the semiconductor body 10 of an individual laser from the block 14. Said semiconductor body 10 is then ready for final mounting (see FIG. 5).

According to the invention, the strip-shaped openings 15 are formed in the metal layer 11 at the areas of the end faces 50, 51 to be formed before the block 14 is formed, a score 16 is then provided in each opening 15 in the longitudinal direction thereof in the surface of the semiconductor body 10, whereupon the solder layer 13 is provided over the metal layer 11 and over at least part of, here the entirety of the openings 15 in said layer, after which the block 14 is formed through cleaving at the areas of and in the direction of the scores 16. The absence of the metal layer 11 at the area of each score 16 renders it more easy to cleave, while it is avoided that portions of the metal layer 11 projecting beyond the block 14 are formed during cleaving, which portions when being bent against the end faces 50, 51 could cause short-circuits. The minimum width of the openings 15 required for placing the scores 16 is approximately 20 μm. The provision of the scores 16 before the solder layer 13 is provided renders it possible to provide the solder layer 13 to close to or up to the end faces 50, 51 to be formed. It was surprisingly found that, even if the solder layer 13 fully covers the surface, a satisfactory block 14 can still be cleaved from the semiconductor body 10. This means that the block 14 has very plane side surfaces 50, 51 free from defects. Since the solder layer 13 is present also at least adjacent, in the present example up to the end faces 50, 51 to be formed, the solderability of a laser to be obtained is excellent. The quality of the soldered joint adjacent such an end face 50, 51 is of major importance because a reduced heat removal in these locations promotes the so-called mirror degradation. The above means that the solder layer 13 may very well be provided in the wafer stage, so that manufacture is simple.

It is highly surprising, moreover, that cleaving proceeds very satisfactorily even if the solder layer 13 is comparatively thick, i.e. has a thickness from 1 to 8 μm, or 4 μm as in the present example, covering the strip-shaped openings 15 entirely. Especially a somewhat brittle solder layer 13, comprising an AuSn alloy as in the present example, yields very good results then. A thick solder layer 13 in its turn implies that any further solder layer on a support body on which a laser to be obtained will be mounted may be thin or entirely absent. A thin or even absent further solder layer means in any case that the risk of short-circuits is reduced. If no further solder layer is provided on the support body, the manufacture of the laser, including soldering thereof on a support body, is considerably simplified.

FIG. 6 diagrammatically and in perspective view shows a laser manufactured by a method according to the invention and mounted on a support body 30. The support body 30 here comprises an electrically insulating substrate 30 which is provided with a metal layer 31 in the form of two metal strips 31 on one of which the semiconductor body 10 of FIG. 5 is fastened with its semiconductor layer structure facing downwards, through soldering of the solder layer 13. Soldering took place here in a reflow oven. The metal layer 12 is connected to the other metal strip 31 by means of a wire connection 32. The metal strips 31 may be provided, for example, with connection conductors for a current source.

The invention is not limited to the embodiment described, since many modifications and variations are possible within the art within the scope of the invention. Thus each conductivity type may be replaced by its opposite, and alternative semiconductor materials may be used instead of those mentioned. Instead of the InP/InGaAsP material system of the example, with which lasers are obtained which emit in the infrared part of the spectrum, GaAs/AlGaAs and InGaP/InAlGaP may also be used, covering the wavelength regions from 0.5 to 1 μm. The invention may also be applied to a material system other than a III–V system, such as a II–VI material system.

The support body used may alternatively be an electrically (and thermally) well conducting body, for example made of Cu. In that case the upper connection of the laser should obviously be modified. Besides semi-insulating semiconductor materials, ceramic materials such as aluminum nitride are also possible for forming an electrically insulating support body.

Solders other than AuSn may be used, such as In or Sn solder, or mixtures thereof.

We claim:

1. A method of manufacturing a semiconductor diode laser whereby a semiconductor body (10) is formed through the application on a substrate (1) of a semiconductor layer structure (2,3,4,6,7) with at least a first cladding layer (2) of a first conductivity type, an active layer (4), and a second cladding layer (3) of a second conductivity type opposed to the first, while in the active layer (4) at least one strip-shaped active region (4A) is formed in a resonance cavity which is situated between two end faces (50,51) to be formed and whose longitudinal axis is approximately perpendicular to the end faces (50,51) to be formed, and the cladding layers (2,3) are provided with current supply means (11,12) which comprise at least a metal layer (11) which is applied to the surface of the semiconductor layer structure (2,3,4,6,7) and which is provided with a solder layer (13), whereupon the semiconductor body (10) is cleaved so as to form a block (14) whose longitudinal axis is perpendicular to that of the at least one strip-shaped active region (4A), whose side faces (50,51) form the end faces (50,51), and from which individual semiconductor diode lasers can be obtained through cleaving or breaking, characterized in that at least two strip-shaped openings (15) are formed in the metal layer (11) at the areas of the end faces (50,51) to be formed before the formation of the block (14), subsequently a score (16) is provided in the surface of the semiconductor body (10) in the strip-shaped openings (15) and in the longitudinal direction thereof, whereupon the solder layer (13) is provided over the metal layer (11) and over at least a portion of the strip-shaped openings (15) in the metal layer (11), and the block (14) is formed through cleaving at the areas of and in the direction of the scores (16).

2. A method as claimed in claim 1, characterized in that the solder layer (13) is provided over the entire strip-shaped openings (15) in the metal layer (11).

3. A method as claimed in claim 1, characterized in that the solder layer (13) is formed by an AuSn solder (13), preferably comprising approximately 80% Au and approximately 20% Sn by weight.

4. A method as claimed in claim 1, characterized in that a thickness is chosen for the solder layer (13) which lies between 1 and 8 µm, preferably between 1 and 5 µm.

5. A method as claimed in claim 1, characterized in that at least two further strip-shaped openings (17) are provided in the metal layer (11) on either side of and parallel to the strip-shaped active region (4A), preferably simultaneously with the strip-shaped openings (15).

6. A method as claimed in claim 5, characterized in that, after the formation of the further strip-shaped openings (17) but before the provision of the solder layer (13), a further score (18) perpendicular to the score (16) is provided in the surface of the semiconductor body (10) in each further strip-shaped opening (17) at the area of the block (14) to be formed, the solder layer (13) is provided also over said further strip-shaped openings (17), and the block (14) after being formed is cleaved at the areas of the further scores (18) whereby a semiconductor body (10) of an individual semiconductor diode laser is obtained.

7. A method as claimed in claim 5, characterized in that other strip-shaped openings (19) are formed in the solder layer (13) above the further strip-shaped openings (17) in the metal layer (11), and the block (14) after being formed is broken or, after the provision of further scores (18) in the surface of the block (14) in the further and other strip-shaped openings (17, 19), is cleaved at the areas of the further and other strip-shaped openings (17, 19), whereby a semiconductor body (10) of an individual semiconductor diode laser is obtained.

8. A method as claimed in claim 7, characterized in that the other strip-shaped openings (19) in the solder layer (13) are formed through the application of wires (20) on the surface of the semiconductor body (10) at the areas of the further strip-shaped openings (17) before the solder layer (13) is provided.

9. A method as claimed in claim 6, characterized in that the semiconductor body (10) of an individual semiconductor diode laser obtained is fastened on a support body (30) provided with a further metal layer (31) through soldering exclusively by means of the solder layer (13).

10. A method as claimed in claim 5, characterized in that the strip-shaped openings (15) and the further strip-shaped openings (17) are formed by photolithography and etching, and the solder layer (13) is provided by means of vapor deposition or sputtering.

* * * * *